(12) United States Patent
Zhang et al.

(10) Patent No.: US 9,045,689 B2
(45) Date of Patent: Jun. 2, 2015

(54) YELLOW LIGHT AFTERGLOW MATERIAL AND PREPARATION METHOD THEREOF AS WELL AS LED ILLUMINATING DEVICE USING SAME

(75) Inventors: Hongjie Zhang, Jilin (CN); Ming Zhang, Sichuan (CN); Chengyu Li, Jilin (CN); Kun Zhao, Sichuan (CN); Hao Zhang, Sichuan (CN)

(73) Assignees: SICHUAN SUNFOR LIGHT CO., LTD., Chendu, Sichuan (CN); CHANGCHUN INSTITUTE OF APPLIED CHEMISTRY, CHINESE ACADEMY OF SCIENCES, Changchun, Jilin (CN)

( * ) Notice: Subject to any disclaimer, the term of this patent is extended or adjusted under 35 U.S.C. 154(b) by 478 days.

(21) Appl. No.: 13/497,129

(22) PCT Filed: Nov. 9, 2009

(86) PCT No.: PCT/CN2009/074860
§ 371 (c)(1),
(2), (4) Date: Mar. 20, 2012

(87) PCT Pub. No.: WO2011/032328
PCT Pub. Date: Mar. 24, 2011

(65) Prior Publication Data
US 2012/0181566 A1 Jul. 19, 2012

(30) Foreign Application Priority Data

Sep. 21, 2009 (CN) .............................. 200910307357

(51) Int. Cl.
*C09K 11/80* (2006.01)
*H01L 33/00* (2010.01)
*C09K 11/77* (2006.01)
*H01L 33/50* (2010.01)

(52) U.S. Cl.
CPC ........... *C09K 11/7774* (2013.01); *H01L 33/502* (2013.01)

(58) Field of Classification Search
USPC ....... 252/301.4 R, 301.4 F, 301.4 P; 313/503; 257/98
See application file for complete search history.

(56) References Cited

U.S. PATENT DOCUMENTS

| 7,267,786 B2 * | 9/2007 | Fiedler et al. ........... 252/301.4 F |
| 2009/0159915 A1 * | 6/2009 | Branchevsky .................. 257/98 |
| 2009/0200515 A1 * | 8/2009 | Oshio ..................... 252/301.4 F |
| 2009/0200957 A1 * | 8/2009 | Fukasawa ...................... 315/291 |
| 2009/0212314 A1 * | 8/2009 | Im et al. ......................... 257/98 |

FOREIGN PATENT DOCUMENTS

| CN | 1362465 A | 8/2002 |
| JP | 4883086 | 11/1973 |

OTHER PUBLICATIONS

International Search Report for PCT/CN2009/074860 dated Jun. 24, 2010.

* cited by examiner

*Primary Examiner* — Carol M Koslow
(74) *Attorney, Agent, or Firm* — Michael Ye; Andrews Kurth LLP

(57) ABSTRACT

The invention relates to a yellow light afterglow material and a preparation method thereof as well as an LED illuminating device using the same. The yellow light afterglow material comprises the chemical formula of $aY_2O_3.bAl_2O_3.cSiO_2$: $mCe.nB.xNa.yP$, where a, b, c, m, n, x and y are coefficients, and a is not less than 1 but not more than 2, b is not less than 2 but not more than 3, c is not less than 0.001 but not more than 1, m is not less than 0.0001 but not more than 0.6, n is not less than 0.0001 but not more than 0.5, x is not less than 0.0001 but not more than 0.2, and y is not less than 0.0001 but not more than 0.5; wherein Y, Al and Si are substrate elements, and Ce, B, Na and P are activators. The yellow light afterglow material is prepared by the following steps: weighing oxides of elements or materials which can generate oxides at high temperature by molar ratio as raw materials, evenly mixing and then sintering the raw materials at 1200-1700° in a reducing atmosphere.

13 Claims, 3 Drawing Sheets

US 9,045,689 B2

YELLOW LIGHT AFTERGLOW MATERIAL AND PREPARATION METHOD THEREOF AS WELL AS LED ILLUMINATING DEVICE USING SAME

FIELD OF THE INVENTION

The invention relates to a yellow light afterglow material and a preparation method thereof as well as an LED illuminating device using the same, more particularly to a yellow light afterglow material using trivalent Ce as luminescent ions, and B, Na and P as a defect center, and a DC and/or AC LED illuminating device using the afterglow luminescent material.

DESCRIPTION OF THE RELATED ART

The reason for afterglow phenomenon is that materials have defect levels, the defect levels capture holes or electrons at activation stage, the electrons and holes slowly release due to thermal motion at room temperature after activation, and combine to release energy, resulting in the afterglow phenomenon. When the materials are heated, the electrons and/or holes in the defect levels will release quickly, causing the materials to emit bright thermoluminescence. Green-light long afterglow materials are frequently reported at present, while reports on the yellow light afterglow materials are few. CN1324109C discloses a $Y_2O_2S$ yellow light afterglow material activated with rare earth activator-free trivalent titanium and a preparation method thereof, and CN100491497C discloses an alkali earth metal silicate long afterglow luminescent material activated with $Eu^{2+}$. On the basis of systematic research on the rare earth long afterglow luminescent material, we put forward and verified such a research and development viewpoint on the afterglow luminescent materials: a defect level of appropriate depth can be created in a luminescent material which does not have afterglow property but has excellent luminescent property by being purposefully introduced into a defect center, so that the defect level can effectively store external luminous energy, and then the stored energy sustainably releases under the action of external thermal excitation and is transferred to luminescent ions, resulting in the afterglow phenomenon. Most of afterglow luminescent powder reported has good afterglow properties by adding coactive ions to the materials to form the defect centers, such as Chinese patents CN1152114C, CN1151988C and 200610172187.9.

A luminescent material $Y_3Al_5O_{12}:Ce^{3+}$ was reported on page 53, Volume 11 of *Appl. Phys. Lett.* in 1967, the material has yellow luminescence, with the strongest luminescent wavelength at 550 nm, and fluorescence lifetime less than 100 ns. The realization of LED white light emission using yellow luminescence of $Y_3Al_5O_{12}:Ce^{3+}$ and blue light gallium nitride was reported on page 417, No. 64 of *Appl. Phys. A* in 1997. $Y_3Al_5O_{12}:Ce^{3+}$ was not reported to have afterglow luminescence.

At present, LED is used for illumination, display, backlight and other fields, and considered as the most promising next generation illuminating pattern for energy conservation, durability, no pollution and other advantages, and draws extensive attention. Various solutions are adopted to realize white light LED, among which combination of a blue light LED chip and yellow fluorescent powder for realization of the white light emission is the most mature technical solution for preparing the white light LED at present. However, in practical application, luminescent intensity of the blue light LED chip and the fluorescent powder will decrease with temperature rise of devices during operation, and decrease in the luminescent intensity of the fluorescent powder is more significant, affecting the use of the LED. Conventional LED uses DC as driving energy. However, household power, industrial/commercial or public power are mostly supplied in AC at present, the LED must be provided with a rectifier transformer for AC/DC conversion in case of being used for illumination and other applications so as to ensure normal operation of the LED. In the process of AC/DC conversion, power loss is up to 15-30%, the cost of conversion equipment is considerable, installation takes a lot of work and time, and the efficiency is not high. Chinese patent CN100464111C discloses an AC LED lamp which connects LED chips of different emitting colors to AC power supply in parallel, mainly describes that the LED chips of different colors form white light and a specific circuit thereof (e.g. red, green and blue light emitting chips), and does not relate to the luminescent powder. U.S. Pat. No. 7,489,086,B2 discloses an AC LED driving device and a illuminating device using the same, the patent also focuses on circuit composition, and the luminescent powder is still the conventional $Y_3Al_5O_{12}:Ce^{3+}$ luminescent powder. So far, realization of AC LED from the luminescent materials has not been reported.

SUMMARY OF THE INVENTION

A technical problem to be solved by the invention is to provide a new yellow light afterglow material, providing a new choice for the afterglow material field, especially the LED technical field.

The yellow light afterglow material of the invention comprises the following chemical formula:

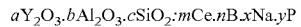

$aY_2O_3 \cdot bAl_2O_3 \cdot cSiO_2 \cdot mCe \cdot nB \cdot xNa \cdot yP$ where, a, b, c, m, n, x and y are coefficients, and a is not less than 1 but not more than 2, b is not less than 2 but not more than 3, c is not less than 0.001 but not more than 1, m is not less than 0.0001 but not more than 0.6, n is not less than 0.0001 but not more than 0.5, x is not less than 0.0001 but not more than 0.2, and y is not less than 0.0001 but not more than 0.5.

The yellow light afterglow material of the invention uses trivalent Ce as luminescent ions, and B, Na and P as a defect center. When excited by ultraviolet light and visible light, the material of the invention emits bright yellow afterglow.

The invention also provides a preparation method of the yellow light afterglow material, and the method comprises the following steps: evenly mixing raw materials by molar ratio, sintering the raw materials at 1200-1700° for 1-8 h in a reducing atmosphere once or several times, preferably at 1400-1600° for 2-5 h.

The invention also provides a DC LED illuminating device using the yellow light afterglow material, and refers to FIG. 1 for schematic diagram of an LED basic module of the illuminating device. As the material of the invention has thermoluminescence effect, the material can compensate temperature quenching generated by using the conventional luminescent powder when the device is at a high operating temperature, maintaining the overall luminescence of the LED illuminating device in operation at a relatively stable level.

The invention also provides an AC LED illuminating device using the yellow light afterglow material, and refers to FIG. 2 for schematic diagram of an LED basic module of the illuminating device. It can be seen from the figure that AC input can be realized by connecting two reverse LEDs in parallel. As the yellow light afterglow material of the invention has afterglow luminescence characteristics, when the material is applied to the AC LED illuminating device, afterglow of the luminescent powder can compensate weaker LED luminescence due to current drop when current cycle changes, thus maintaining stable light output of the device in AC cycle.

In certain embodiments, the LED illuminating device comprises an LED chip and luminescent powder, wherein the luminescent powder is the yellow light afterglow material, and an emission wavelength of the LED chip is 240-500 nm.

The invention will be further illustrated in detail through preferred embodiments in the form of examples. However, the following examples should not be construed as limit to the scope of the invention, and technologies realized based on the contents of the invention shall fall into the scope of the invention.

DETAILED DESCRIPTION OF THE PREFERRED EMBODIMENTS

The yellow light afterglow material of the invention comprises the following chemical formula:

$aY_2O_3 \cdot bAl_2O_3 \cdot cSiO_2 \cdot mCe \cdot nB \cdot xNa \cdot yP$, where a, b, c, m, n, x and y are coefficients, and a is not less than 1 but not more than 2, b is not less than 2 but not more than 3, c is not less than 0.001 but not more than 1, m is not less than 0.0001 but not more than 0.6, n is not less than 0.0001 but not more than 0.5, x is not less than 0.0001 but not more than 0.2, and y is not less than 0.0001 but not more than 0.5.

Preferably:

a is not less than 1.3 but not more than 1.8, b is not less than 2.3 but not more than 2.7, c is not less than 0.001 but not more than 0.5, m is not less than 0.01 but not more than 0.3, n is not less than 0.01 but not more than 0.3, x is not less than 0.01 but not more than 0.1, and y is not less than 0.01 but not more than 0.5.

More preferably a is not less than 1.3 but not more than 1.5, b is not less than 2.3 but not more than 2.5, c is not less than 0.01 but not more than 0.5, m is not less than 0.01 but not more than 0.3, n is not less than 0.1 but not more than 0.3, x is not less than 0.02 but not more than 0.1, and y is not less than 0.2 but not more than 0.3.

Most preferably:

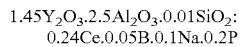

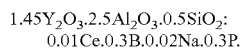

The yellow light afterglow material of the invention uses trivalent Ce as luminescent ions, and B, Na and P as a defect center. When excited by ultraviolet light and visible light, the material of the invention emits bright yellow light afterglow.

The yellow light afterglow material of the invention uses oxides of Y, Al, Si, Ce, Na, B and P or elementary substances and compounds which can generate the oxides at high temperature as raw materials.

The preparation method of the yellow light afterglow material comprises the following steps: evenly mixing the raw materials by molar ratio, sintering the raw materials at 1200-1700° for 1-8 h in a reducing atmosphere once or several times, preferably at 1400-1600° for 2-5 h.

Further, the yellow light afterglow material of the invention has excitation wavelength of 200-500 nm and the strongest emission wavelength of 530-570 nm. The material can store energy from ultraviolet light and/or visible light, and then emit yellow light afterglow at room temperature and emit thermoluminescence when heated, afterglow luminescent and thermoluminescence peak is 530-570 nm, and peak temperature of thermoluminescence is 60-350°.

Figure 1:
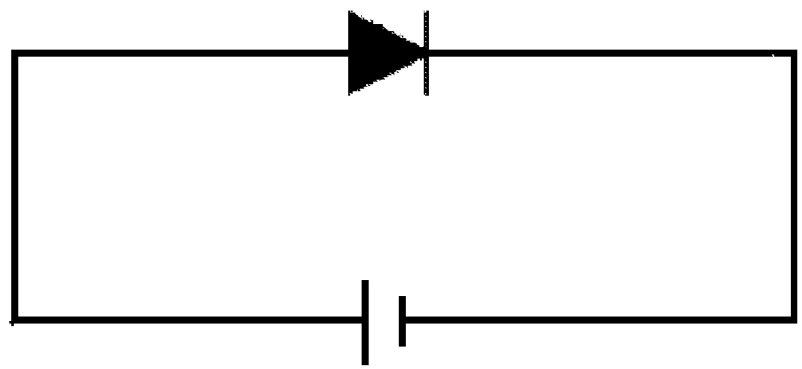
FIG. 1 is a schematic diagram of an LED basic module of a DC LED illuminating device.

Refer to FIG. 1 for schematic diagram of a basic module of a DC LED illuminating device using the yellow light afterglow material of the invention. As the LED illuminating device is at 60-200° in use, the luminance of the conventional YAG:$Ce^{3+}$ luminescent powder will decrease due to higher temperature, therefore, the luminance of the LED illuminating device decreases and luminescence turns blue. As the material of the invention can generate thermoluminescence when heated, and emit yellow fluorescence when excited by blue light LED chips, white light LED illumination can be realized by blue light plus yellow light when the material of the invention is used in the LED illuminating device. However, as the material of the invention has thermoluminescence effect when the temperature of the device rises, and energy in the defect center will release in the form of luminescence when heated, the material can compensate temperature quenching generated by using the conventional YAG:$Ce^{3+}$ luminescent powder when the device is at high operating temperature, maintaining the overall luminescence of the LED illuminating device in operation at a relatively stable level.

Figure 2:
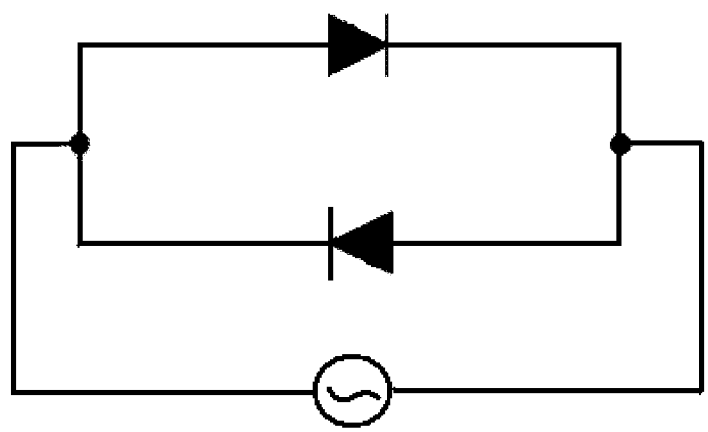
FIG. 2 is a schematic diagram of an LED basic module of an AC LED illuminating device.

Refer to FIG. 2 for schematic diagram of an LED basic module of an AC LED illuminating device using the yellow light afterglow material of the invention. It can be seen from the figure that AC input can be realized by connecting two reverse LEDs in parallel. Luminescence realized by connecting two reverse LEDs in parallel also has periodic luminance change for periodicity of AC, affecting applications of the device. As the yellow light afterglow material of the invention has afterglow luminescence characteristics, when the material is applied to the AC LED illuminating device, afterglow of the luminescent powder can compensate weaker LED luminescence due to current drop when current cycle changes, thus maintaining stable light output of the device in AC cycle.

The invention will be further described through preferred embodiments, but the following examples should not be construed as limit thereto. It should be understood by those skilled in the art that various modifications, replacements and changes can be made according to the technical thought of the invention.

Examples 1-12

Yttrium oxide, alumina, silica, cerium dioxide, sodium bicarbonate, boric acid and monoammonium phosphate were fully mixed according to the mixture ratio in Table 1, and sintered at 1550° for 4 h in a mixture atmosphere of hydrogen and nitrogen to obtain a finished product after crushing, sieving, pickling and washing with water and alcohol. Then the phosphor was encapsulated into a basic unit such as the DC and/or AC LED illuminating device as shown in FIG. 1 and FIG. 2 to obtain an LED illuminating device.

$Y_{2.94}Ce_{0.06}Al_5O_{12}$ was prepared by the same process route as a reference sample.

TABLE 1

| Sample | Mixture ratio of sample materials (mol) | | | | | | |
|---|---|---|---|---|---|---|---|
| | Yttrium oxide | Alumina | Silica | Cerium dioxide | Boric acid | Sodium bicarbonate | Monoammonium phosphate |
| Reference sample | 1.47 | 2.5 | 0 | 0.06 | 0 | 0 | 0 |
| 1 | 1.5 | 2.6 | 0.01 | 0.1 | 0.05 | 0.1 | 0.2 |
| 2 | 1.45 | 2.5 | 0.01 | 0.24 | 0.05 | 0.1 | 0.2 |
| 3 | 1 | 2.05 | 0.001 | 0.0001 | 0.1 | 0.002 | 0.01 |
| 4 | 1.2 | 2.2 | 0.005 | 0.05 | 0.06 | 0.0001 | 0.08 |
| 5 | 1.85 | 2.7 | 0.12 | 0.008 | 0.0065 | 0.05 | 0.004 |
| 6 | 2 | 2.95 | 1 | 0.2 | 0.3 | 0.04 | 0.04 |
| 7 | 1.45 | 2.5 | 0.002 | 0.6 | 0.15 | 0.03 | 0.3 |
| 8 | 1.45 | 2.5 | 0.5 | 0.01 | 0.3 | 0.02 | 0.3 |
| 9 | 1.45 | 2.5 | 0.01 | 0.3 | 0.5 | 0.01 | 0.0001 |
| 10 | 1.75 | 3 | 0.01 | 0.34 | 0.02 | 0.06 | 0.4 |
| 11 | 1.15 | 2 | 0.014 | 0.18 | 0.25 | 0.003 | 0.26 |
| 12 | 1.4 | 2.45 | 0.02 | 0.15 | 0.0001 | 0.2 | 0.5 |

Test Example 1

Luminescence Temperature Characteristics of the Material of the Invention

All samples and the reference sample in Table 1 were put in a temperature control heating device, and excited by an LED with emission wavelength of 460 nm. Luminance was read by a luminance meter at different temperatures. Refer to Table 2 for results.

TABLE 2

| Sample | 25° C. | 80° C. | 150° C. | 200° C. |
|---|---|---|---|---|
| Reference sample | 100 | 100 | 100 | 100 |
| 1 | 99 | 105 | 110 | 110 |
| 2 | 105 | 110 | 115 | 110 |
| 3 | 94 | 103 | 110 | 115 |
| 4 | 93 | 108 | 105 | 108 |
| 5 | 93 | 103 | 106 | 106 |
| 6 | 95 | 105 | 105 | 108 |
| 7 | 90 | 102 | 106 | 105 |
| 8 | 102 | 106 | 110 | 111 |
| 9 | 106 | 108 | 110 | 109 |
| 10 | 99 | 110 | 105 | 106 |
| 11 | 90 | 102 | 103 | 105 |
| 12 | 98 | 105 | 110 | 110 |

It can be seen from Table 2 that the luminance of the yellow light afterglow material of the invention is greater than that of current $Y_{2.94}Ce_{0.06}Al_5O_{12}$ luminescent powder at the operating temperature of the LED illuminating device (>80°), thus being capable of solving temperature quenching problems of luminance of the existing DC LED illuminating devices.

Test Example 2

Afterglow Characteristics of the Material of the Invention

All samples and the reference sample in Table 1 were excited by an LED with dominant emission wavelength of 460 nm for 15 minutes, and afterglow thereafter was tested by a glow tester equipped with a photomultiplier. Refer to Table 3 for results.

TABLE 3

| Sample | Luminance at 0 second | Luminance at 30 seconds | Luminance at 1 minute |
|---|---|---|---|
| Reference sample | 0 | 0 | 0 |
| 1 | 100 | 100 | 100 |
| 2 | 120 | 118 | 116 |
| 3 | 86 | 80 | 81 |
| 4 | 90 | 91 | 90 |
| 5 | 70 | 74 | 70 |
| 6 | 65 | 63 | 63 |
| 7 | 104 | 105 | 106 |
| 8 | 110 | 112 | 110 |
| 9 | 88 | 80 | 81 |
| 10 | 80 | 85 | 81 |
| 11 | 75 | 71 | 70 |
| 12 | 65 | 60 | 65 |

Luminance values in Table 3 took sample 1 as a reference. Afterglow luminescence value of the reference sample below the lower limit of a testing instrument 1 mcd/m², and can not be read, thus being recorded as 0.

Figure 3:
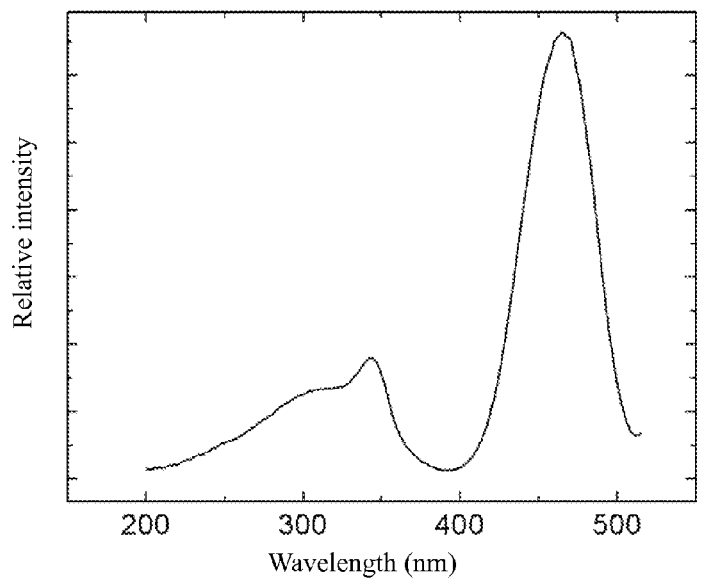
FIG. 3 is an excitation spectrum of sample 2.
Figure 4:
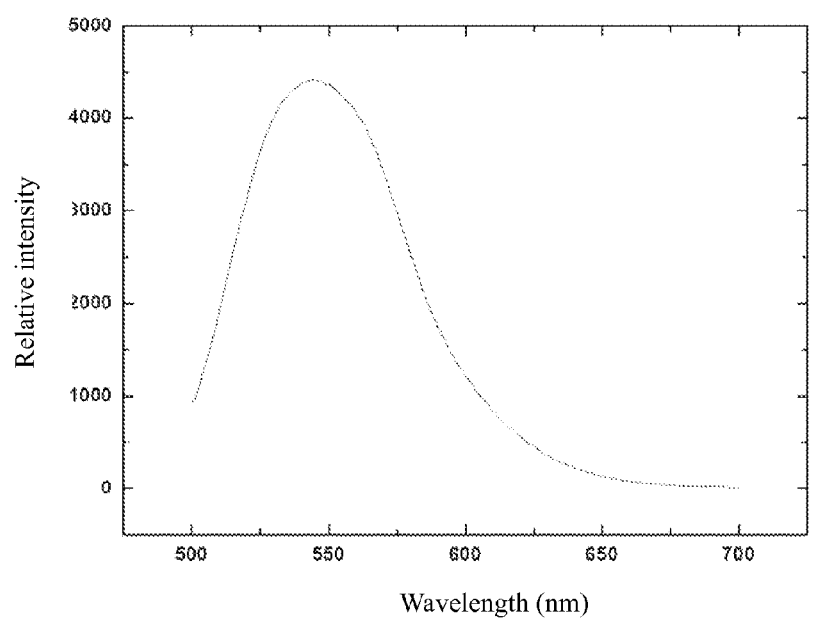
FIG. 4 is a photoluminescence spectrum of the sample 2.
Figure 5:
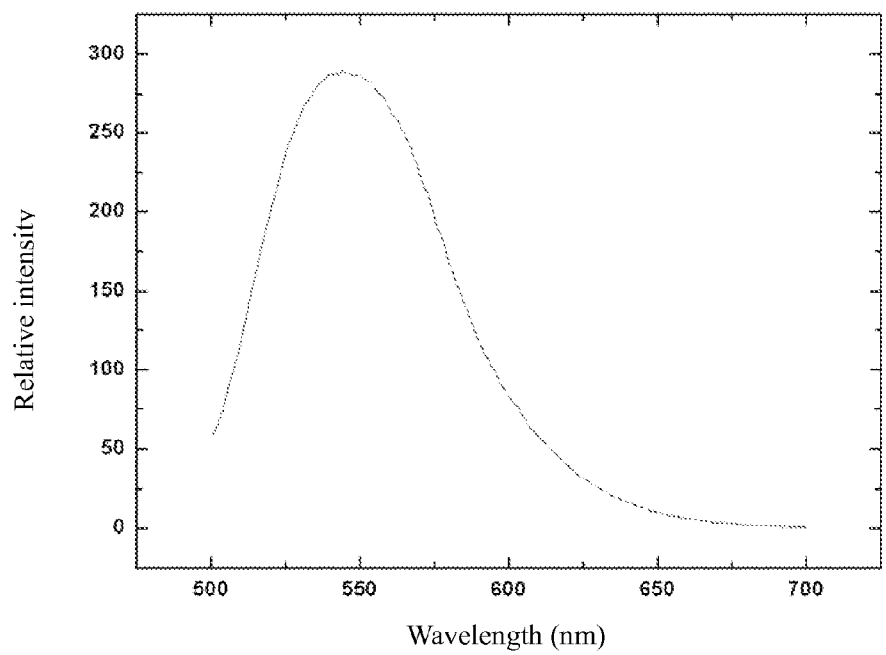
FIG. 5 is an afterglow spectrum of the sample 2.
Figure 6:
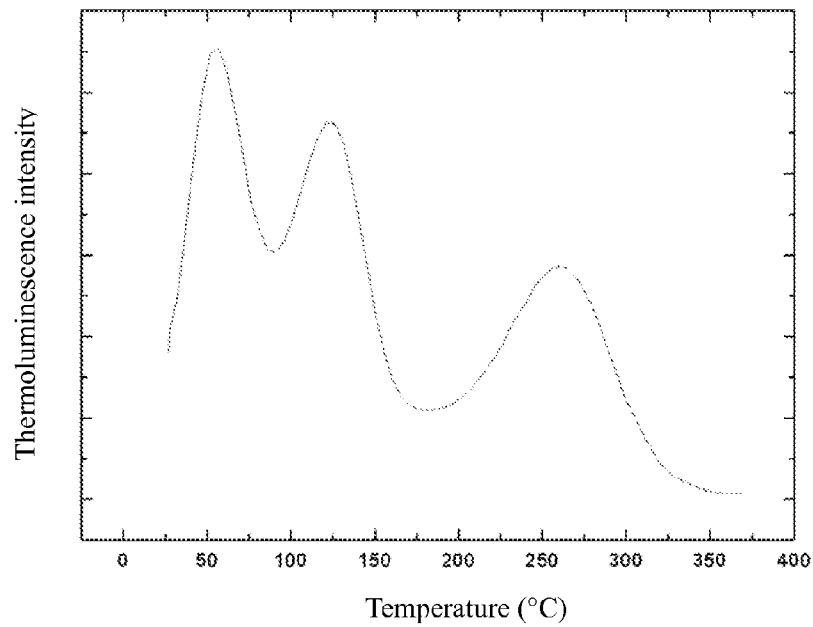
FIG. 6 is a thermoluminescence spectrum of the sample 2.

FIG. 3 is an excitation spectrum of sample 2, FIG. 4 is a photoluminescence spectrum of the sample 2, FIG. 3 and FIG. 4 show that the material of the invention emits yellow fluorescence when excited by ultraviolet to visible light. FIG. 5 is an afterglow spectrum of the sample 2, showing that afterglow luminescence of the material of the invention is yellow. FIG. 6 is a thermoluminescence spectrum of sample 2, showing that the material of the invention has thermoluminescence phenomenon when heated to above 60°.

As frequency of common AC is 50 Hz, that is, the period is 20 ms, the direction does not change, and change in current is 10 ms per semi-period. Table 5 provides afterglow luminance within 10 ms tested by a high speed CCD capable of taking 300 pictures per second when the sample 2 is excited by an LED with dominant emission wavelength of 460 nm for 15 minutes and the excitation stops. Refer to Table 4 for results.

TABLE 4

| | 3.33 ms | 6.66 ms | 9.99 ms |
|---|---|---|---|
| Reference sample | 2 | 1 | 1 |
| Sample 2 | 1527 | 1510 | 1505 |

It can be seen from Table 4 that the material of the invention has afterglow luminescence, while the existing $Y_{2.94}Ce_{0.06}Al_5O_{12}$ luminescent powder does not have afterglow luminescence. The figures in Table 4 show that the luminescent material of the invention has stronger afterglow luminescence within the AC cycle, and can effectively compensate luminescent intensity loss due to the current drop. The afterglow value of the reference sample is caused by instrument noise, and can be ignored.

The figures in Tables 2 to 4 show that the material of the invention has the afterglow luminescence characteristics compared with the material $Y_{2.94}Ce_{0.06}Al_5O_{12}$ reported by documents, and the DC and/or AC LED illuminating device of the basic unit (as shown in FIG. 1 and FIG. 2) using the yellow light afterglow material of the invention has obvious novelty and creativity.

What is claimed is:

1. A yellow light afterglow material, comprising the following chemical formula:

$aY_2O_3 \cdot bAl_2O_3 \cdot cSiO_2:mCe \cdot nB \cdot xNa \cdot yP$, wherein a, b, c, m, n, x and y are coefficients, and a is not less than 1 but not more than 2, b is not less than 2 but not more than 3, c is not less than 0.001 but not more than 1, m is not less than 0.0001 but not more than 0.6, n is not less than 0.0001 but not more than 0.5, x is not less than 0.0001 but not more than 0.2, and y is not less than 0.0001 but not more than 0.5.

2. The yellow light afterglow material of claim 1, wherein a is not less than 1.3 but not more than 1.8, b is not less than 2.3 but not more than 2.7, c is not less than 0.001 but not more than 0.5, m is not less than 0.01 but not more than 0.3, n is not less than 0.01 but not more than 0.3, x is not less than 0.01 but not more than 0.1, and y is not less than 0.01 but not more than 0.5.

3. The yellow light afterglow material of claim 2, wherein a is not less than 1.3 but not more than 1.5, b is not less than 2.3 but not more than 2.5, c is not less than 0.01 but not more than 0.5, m is not less than 0.01 but not more than 0.3, n is not less than 0.1 but not more than 0.3, x is not less than 0.02 but not more than 0.1, and y is not less than 0.2 but not more than 0.3.

4. The yellow light afterglow material of claim 1, comprising a compound having the following chemical formula:

$1.45Y_2O_3 \cdot 2.5Al_2O_3 \cdot 0.01SiO_2:0.24Ce \cdot 0.05B \cdot 0.1Na \cdot 0.2P$ or $1.45Y_2O_3 \cdot 2.5Al_2O_3 \cdot 0.5SiO_2:0.01Ce \cdot 0.3B \cdot 0.02Na \cdot 0.3P$.

5. The yellow light afterglow material of claim 1, wherein an excitation wavelength of the yellow light afterglow material is from 200 nm to 500 nm, and a strongest emission wavelength is from 530 nm to 570 nm.

6. The yellow light afterglow material of claim 5, wherein a thermoluminescence peak of the yellow light afterglow material is from 530 nm to 570 nm, and a peak temperature of thermoluminescence is from 60° to 350°.

7. A method for preparing the yellow light afterglow material of claim 1, comprising the following steps:
weighing oxides of elements or materials which can generate oxides at high temperature by molar ratio as raw materials; and
evenly mixing and then sintering the raw materials at 1200-1700° in a reducing atmosphere.

8. The method for preparing the yellow light afterglow material of claim 7, wherein a sintering temperature is 1400-1600°, and a sintering time is 2-5 h.

9. An LED illuminating device, comprising an LED chip and luminescent powder, wherein the luminescent powder is the yellow light afterglow material of claim 1, and an emission wavelength of the LED chip is 240-500 nm.

10. The yellow light afterglow material of claim 4, wherein an excitation wavelength of the yellow light afterglow material is from 200 nm to 500 nm, and a strongest emission wavelength is from 530 nm to 570 nm.

11. The yellow light afterglow material of claim 10, wherein a thermoluminescence peak of the yellow light afterglow material is from 530 nm to 570 nm, and a peak temperature of thermoluminescence is from 60° to 350°.

12. A method for preparing the yellow light afterglow material of claim 11, comprising the following steps:
weighing oxides of elements or materials which can generate oxides at high temperature by molar ratio as raw materials; and
evenly mixing and then sintering the raw materials at 1200-1700° in a reducing atmosphere.

13. An LED illuminating device, comprising an LED chip and luminescent powder, wherein the luminescent powder is the yellow light afterglow material of claim 11, and an emission wavelength of the LED chip is 240-500 nm.

\* \* \* \* \*